(12) United States Patent
Bahlawane

(10) Patent No.: US 10,710,935 B2
(45) Date of Patent: Jul. 14, 2020

(54) CERAMIC COMPOSITE AND PRODUCTION METHOD THEREOF

(71) Applicant: Luxembourg Institute of Science and Technology (LIST), Esch sur Alzette (LU)

(72) Inventor: Naoufal Bahlawane, Belvaux (LU)

(73) Assignee: LUXEMBOURG INSTITUTE OF SCIENCE AND TECHNOLOGY (LIST), Esche sur Alzette (LU)

( * ) Notice: Subject to any disclaimer, the term of this patent is extended or adjusted under 35 U.S.C. 154(b) by 203 days.

(21) Appl. No.: 15/740,463

(22) PCT Filed: Jun. 28, 2016

(86) PCT No.: PCT/EP2016/065015
§ 371 (c)(1),
(2) Date: Dec. 28, 2017

(87) PCT Pub. No.: WO2017/001405
PCT Pub. Date: Jan. 5, 2017

(65) Prior Publication Data
US 2018/0186701 A1    Jul. 5, 2018

(30) Foreign Application Priority Data
Jun. 29, 2015 (LU) .......................................... 92757

(51) Int. Cl.
*C04B 35/74* (2006.01)
*C04B 35/622* (2006.01)
(Continued)

(52) U.S. Cl.
CPC .............. *C04B 35/74* (2013.01); *C04B 35/01* (2013.01); *C04B 35/495* (2013.01);
(Continued)

(58) Field of Classification Search
USPC ................................. 428/325, 408, 698, 701
See application file for complete search history.

(56) References Cited

U.S. PATENT DOCUMENTS

2010/0157437 A1   6/2010   Higginson et al.
2015/0137836 A1*  5/2015   Kim ..................... G01N 27/127
                                              324/693

FOREIGN PATENT DOCUMENTS

CN          1676244       * 10/2005
DE     102006033037 A1     1/2008
                 (Continued)

OTHER PUBLICATIONS

Bahlawane et al "Advances in the deposition chemistry of metal-containing thin film using phase processes" Chem. Sc. 3, pp. 929-941. (Year: 2012).*

(Continued)

*Primary Examiner* — Archene A Turner
(74) *Attorney, Agent, or Firm* — Cantor Colburn LLP

(57) ABSTRACT

A black ceramic composite coating is presented. The ceramic composite coating comprises a ceramic matrix having embedded therein carbide nanoparticles (in particular metal carbide nanoparticles) and/or metal-carbon composite nanoparticles (with separate metal and carbon phases) embedded therein. The carbide nanoparticles are metastable and the metal-carbon composite nanoparticles are decay products of the metastable carbide nanoparticles. A further aspect of the invention relates to producing such a ceramic composite coating.

19 Claims, 4 Drawing Sheets

(51) Int. Cl.
    *C23C 16/00*     (2006.01)
    *C04B 35/495*     (2006.01)
    *C23C 16/30*     (2006.01)
    *C04B 35/01*     (2006.01)
    *C04B 35/64*     (2006.01)
    *C23C 16/32*     (2006.01)
    *C23C 16/448*     (2006.01)
    *C23C 16/455*     (2006.01)
    *C23C 16/56*     (2006.01)

(52) U.S. Cl.
    CPC ........ *C04B 35/62222* (2013.01); *C04B 35/64* (2013.01); *C23C 16/006* (2013.01); *C23C 16/30* (2013.01); *C23C 16/32* (2013.01); *C23C 16/4486* (2013.01); *C23C 16/45523* (2013.01); *C23C 16/56* (2013.01); *C04B 2235/3239* (2013.01); *C04B 2235/3817* (2013.01); *C04B 2235/781* (2013.01); *C04B 2235/80* (2013.01)

(56) References Cited

FOREIGN PATENT DOCUMENTS

| | | |
|---|---|---|
| GB | 2425976 A | 11/2006 |
| JP | 2010156286 A | 7/2010 |

OTHER PUBLICATIONS

Chen et al "Synthesis of novel CoC(x)@C nanoparticles" Nanotechnology 24, p045602 pp. 1-8 (Year: 2013).*

Bahlawane et al "Catalytically enhanced H2-free CVD of transition metals using commercially available precursors"; Surface & Coatings Technology; 2007; 201; 8914-8918.

Bahlawane et al "Self-catalyzed chemical vapor deposition method for the growth of device-quality metal thin films"; Microelectronic Engineering; 2007; 84; 2481-2485.

International Search Report; International Application No. PCT/EP2016/065015; International Filing Date Jun. 28, 2016; dated Sep. 7, 2016; 4 pages.

Ohji et al "Strengthening and Toughening Mechanisms of Ceramic Nanocomposites"; Journal of American Ceramic Society; 1996; vol. 81, No. 6; 1453-1460.

Persky "Review of black surfaces for space-borne infrared systems"; Review of Scientic Instruments; 1999; vol. 70, No. 5; 2193-2217.

Premkumar et al "CVD of Metals Using Alcohols and Metal Acetylacetonates, Part I: Optimization of Process Parameters and Electrical Characterization of Synthesized Films"; Chem. Vap. Deposition; 2007; 13; 219-226.

Premkumar et al "CVD of Metals Using Alcohols and Metal Acetyiacetoriates, Part II: Role of Solvent and Characterization of Metal Films Made by Pulsed Spray Evaporation CVD"; Chem. Vap. Deposition; 2007; 13; 227-231.

Premkumar et al "Effect of Solvent on the Growth of Co and Co2C Using Pulsed-Spray Evaporation Chemical Vapor Deposition"; Chem. Mater.; 2007; 19; 6206-6211.

Written Opinion of the International Searching Authority; International Application No. PCT/EP2016/065015; International Filing Date Jun. 28, 2016; dated Sep. 7, 2016; 5 pages.

* cited by examiner

CERAMIC COMPOSITE AND PRODUCTION METHOD THEREOF

CROSS REFERENCE TO RELATED APPLICATIONS

This is a U.S. national stage of application No. PCT/EP2016/065015, filed on 28 Jun. 2016. Priority under 35 U.S.C. § 119(a) and 35 U.S.C. § 365(b) is claimed from Luxembourg Application No. 92757 filed on 29 Jun. 2015, the disclosure of which is also incorporated herein by reference in its entirety.

FIELD OF THE INVENTION

The invention generally relates to a novel ceramic composite material and a method for producing such a material. A particularly interesting aspect of the invention relates to a black coating made of a ceramic composite material.

BACKGROUND OF THE INVENTION

The performance of certain optical devices strongly depends on the ability of avoiding and/or eliminating stray light. Stray light reduction is an important issue especially in space-borne astronomical instruments, where it may notably affect both the geometric and the radiometric image quality. To prevent light originating from outside the desired field of view of the instrument, baffles are typically arranged around the optical axis. Such baffles are usually cylindrical or conical and may comprise vanes on their interior walls in order to trap as much stray light as possible. In such systems, the absorptance of undesired off-axis radiation in the spectral range of the detector should be as close as possible to 100% irrespective of the incidence angle. Furthermore, the reflectance of the surfaces should ideally be Lambertian. Black coatings have been developed to cover all mechanical surfaces close to the optical beam. An overview can be found in: M. J. Persky, «Review of black surfaces for space-borne infrared systems», Review of scientific instruments, vol. 70, no 5, p. 2193-2217, 1999. Historically, in most spatial missions, black surfaces were obtained using paints (e.g. Aeroglaze™ from Lord Corporation, DeSoto™ Flat Black from Pacific Western Paints, etc.) or anodizations (e.g. Martin Black™, Enhanced Martin Black™, or Infrablack™ from Martin Marietta Corporation, etc.). Other advanced optically black diffuse surfaces such as plasma sprayed boron-on-beryllium, plasma sprayed boron carbide-on-silicon carbide and plasma sprayed beryllium-on-beryllium have been developed. These are diffuse absorptive surfaces that employ microscopic structures to absorb, scatter or trap light. Other black surfaces can be obtained by electrodeposition (e.g. black chrome, black cobalt) or by electroless nickel coating. In the $21^{st}$ century, several advanced coatings have been developed by various companies. Acktar's inorganic coatings (Nano Black™, Magic Black™, Vacuum Black™, Fractal Black™ and Ultra Black™) are fabricated using vacuum deposition technology and feature very low reflectance, high thermal stability, excellent adhesion, and low outgassing. Surrey NanoSystems have developed a super-black material (called Vantablack™) that absorbs 99.96% of surface light. Vantablack™ is produced using a low-temperature carbon nanotube (CNT) growth process. When light strikes the layer of CNTs, instead of bouncing off it is trapped between the tubes before eventually becoming heat. Titanium and silicon substrates have been used to demonstrate the efficiency.

Apart from optical instruments, black materials, in particular black coatings, have applications in passive thermal management (requiring high emissivity), solar energy harvesting (e.g. solar water heating, concentrated solar power generation, etc.), infrared sensing (e.g. in MEMS IR sensors), thermal actuation (e.g. in MEMS thermal actuators), etc.

It is an object of an aspect of the present invention to provide a ceramic composite that may serve as a black coating. More generally, however, it is an object of the invention to provide a new type of coating.

Aspects of the methods used in the context of the present invention have been developed from earlier works in which the inventor contributed. The interested reader is referred to (1) Bahlawane N, Premkumar P A, Onwuka K, Reiss G, Kohse-Hoinghaus K. Self-catalyzed chemical vapor deposition method for the growth of device-quality metal thin films. Microelectronic Engineering. 2007; 84(11):2481-2485; (2) Bahlawane N, Premkumar P A, Onwuka K, Rott K, Reiss G, Kohse-Hoinghaus K. Catalytically enhanced $H_2$-free CVD of transition metals using commercially available precursors. Surface & Coatings Technology. 2007; 201(22-23):8914-8918; (3) Premkumar P A, Bahlawane N, Kohse-Hoinghaus K. CVD of metals using alcohols and metal acetylacetonates, Part I: Optimization of process parameters and electrical characterization of synthesized films. Chemical Vapor Deposition. 2007; 13(5):219-226; (4) Premkumar P A, Bahlawane N, Reiss G, Kohse-Hoinghaus K. CVD of metals using alcohols and metal acetylacetonates, Part II: Role of solvent and characterization of metal films made by pulsed spray evaporation CVD. Chemical Vapor Deposition. 2007; 13(5):227-231; (5) Premkumar P A, Turchanin A, Bahlawane N. Effect of solvent on the growth of Co and $Co_2C$ using pulsed-spray evaporation chemical vapor deposition. Chemistry of Materials. 2007; 19(25):6206-6211; and (6) German patent application DE 10 2006 033 037 A1, disclosing a one-step method for depositing a metal onto a substrate by means of a gas phase deposition method. According to DE 10 2006 033 037 A1, a metal-containing precursor compound is dissolved in an organic solvent, which serves as a reducing agent that releases the metal species from the metalorganic precursor.

General Description

According to a first aspect of the invention, a ceramic composite coating is presented. The ceramic composite coating comprises a ceramic matrix, which is not a carbide matrix, having embedded therein carbide nanoparticles (in particular metal carbide nanoparticles) and/or metal-carbon composite nanoparticles (with separate metal and carbon phases) embedded therein. The ceramic composite coating may be referred to as an "advanced cermet", since it corresponds to a carbon-pigmented cermet.

The carbide nanoparticles embedded within the ceramic matrix are metastable and the metal-carbon composite nanoparticles are the decay products of the metastable carbide nanoparticles. It is worthwhile noting that the term "metastable" is used herein with its ordinary meaning, i.e. designating a state in which a system may remain for an extended time (when no energy is introduced into the system from the outside), which state is not, however, the system's state of least energy. In the system under consideration, the state of least energy corresponds to the configuration in which a carbon phase and a metal phase coexist as a nanoparticular inclusion within the ceramic matrix. The metastable state (the carbide phase) corresponds to a local minimum of the internal energy of the system, whereas the stable state (the carbon and metal phases) corresponds to the global minimum of the internal energy at room temperature (20° C.) and atmospheric pressure (1013.25 hPa).

The ceramic composite may comprise the metal carbide nanoparticles and the metal-carbon composite nanoparticles in any proportion relative to each other, ranging from 100% carbide nanoparticles and 0% metal-carbon composite nanoparticles to 0% carbide nanoparticles and 100% metal-carbon composite nanoparticles. A ceramic composite with only metal-carbon composite nanoparticles may be obtained by annealing.

The nanoparticles may have an average size (greatest diameter) in the range from 5 to 500 nm, more preferably in the range from 10 to 400 nm, even more preferably in the range from 20 to 300 nm, still more preferably in the range from 20 to 200 nm and most preferably in the range from 20 to 100 nm.

According to a preferred embodiment of the invention, the metal-carbon composite nanoparticles comprise metal cores with carbon shells.

The ceramic matrix may be a boride matrix, a silicide matrix or a nitride matrix. More preferably, however, the ceramic matrix is a metal oxide matrix. Such metal oxide matrix may e.g. consist of an oxide selected from the group consisting of $VO_2$, $Al_2O_3$, $SiO_2$, $MgO$, $TiO_2$, $ZrO_2$, $Mn_3O_4$, $SnO_2$, $ZnO$, spinel having the general formula $AB_2O_3$ with A and B being metal cations having different valences, perovskite having the general formula $A'B'O_3$ with A' and B' being differently sized metal cations, or mixtures thereof.

According to preferred embodiments of the first aspect of the invention, the carbide nanoparticles consist of carbides of metals selected from the group consisting of Ni, Co, Fe, Cr, Mo, Pt, Pd and mixtures thereof.

The density of the carbide nanoparticles and/or metal-carbon composite nanoparticles in the matrix may be uniform. In some embodiments, however, it may be preferred that the density of the carbide nanoparticles and/or metal-carbon composite nanoparticles in the matrix is non-uniform across the thickness of the ceramic composite. The density may have a constant or a non-constant gradient in the thickness direction.

The ceramic composite coating is a black coating, preferably a matte black coating, more preferably a superblack coating, comprising a ceramic composite as described herein. In the context of the present document, the term "black" qualifies a surface with a total hemispherical reflectivity (THR) of no more than 5% over the entire wavelength range from 400 nm to 1 µm and for any incidence angle (angle between the surface and the incoming beam) greater than 20°. A "matte" surface is a surface, whose reflectivity in the specular direction amounts to no more than 5% of the THR, for any incidence angle greater than 20°. As used herein, a "superblack" surface is a matte black surface having, within the wavelength range from 400 nm to 2.5 µm, a total hemispherical reflectivity (THR) of no more than 1% around normal incidence (incidence angle ≥20°) and no more than 10% for grazing incidence (incidence angle <20°).

As will be appreciated, a black coating consisting of the advanced cermet of the present invention offers good absorptance and can be tuned to meet the requirements of a superblack coating. Furthermore, Lambertian reflection behavior can be achieved. The advanced cermet coating is suitable for heat radiation (emittance) and can thus be used in thermal elements and on baffles, vanes or optical elements that need that type of cooling. The advanced cermet is compatible with different kinds of substrates, it can be produced with any desired thickness in the range of 30 nm to 1000 µm. The surface density (mass per unit area) is compatible with most applications. As the fabrication process of the advanced cermet uses chemical vapor deposition (CVD), which involves deposition at elevated temperatures and which may be carried out at low pressures, conditions that are unfavourable for the incorporation of volatile organic molecules or water into the coating, outgassing is not an important issue with advanced cermets. That point is especially advantageous for space and high-vacuum applications. Another advantage of advanced cermets is their ability to withstand direct sun illumination or, more generally speaking, intense radiation without alteration. Last but not least, the chemical inertness of the advanced cermets is an advantage (e.g. low sensitivity to atomic oxygen) appreciated in many applications.

A further aspect of the present invention relates to a method for producing an advanced cermet as described herein using CVD. The method comprises introducing at least one first precursor for depositing the ceramic matrix into a reaction chamber, introducing second precursors for depositing the carbide nanoparticles into the reaction chamber, the second precursors comprising an inorganic, metalorganic or organometallic precursor and at least one of an alcohol and an aldehyde, transporting the precursors to a substrate maintained at the deposition temperature, and forming the ceramic matrix from the at least one first precursor and the embedded carbide nanoparticles from the second precursors.

As used herein, the terms "first precursor" or "first precursors" refer to the precursor or group of precursors from which the ceramic matrix is deposited. The term "second precursors" designates the group of precursors from which the carbide nanoparticles are deposited. The numerals "first" and "second" are used for distinguishing between these precursors or precursor groups; no implication regarding the order or the importance, the quantity etc. of the precursors is thereby intended.

CVD and its different formats, e.g. metalorganic CVD (MOCVD), atomic layer deposition (ALD), pulsed-spray evaporation CVD, etc. are proposed for the production of the advanced cermet coating. These high technological gas-phase processes enable the growth of uniform films even on highly structured surfaces. Gradient carbon-pigmented metal-metal oxide nanocomposite coatings can be achieved. The overall structure features a metal oxide matrix thin film in which particles with controlled size, density and composition are embedded. The process parameters can easily be tuned such that the resulting structures satisfy adhesion and durability criteria. Furthermore, no issues are expected with particulate contamination, outgassing, water uptake and cleanability. The nanoparticles' loading in the ceramic matrix may be performed in a decreasing manner along the deposition process in order to gradually reduce the refractive index and avoid light reflection at the surface. The metal-carbon nanoparticles strongly absorb visible light because of the inter-band transition of the metal phase and the intrinsic absorption bands of the carbon phase. The scattering and absorption efficiencies can be manipulated through the adjustment of the size of the particles and the proportion of carbon to metal. Compared with ordinary cermets, the carbon phases of the nanoparticles lead to an improvement of the absorption behaviour and prevent the coating from overheating.

The proposed fabrication method may involve only moderate heating of the substrate (e.g. up to 350° C. or 400° C.) and thereby offers a great range of possibilities regarding the choice of the substrate. Aluminium parts or other metallic parts in a precise metallurgical state (that shall not be altered) could thus serve as substrates. Other possible substrates are silicon, glass, etc.

Another noteworthy advantage of the proposed method is that it is not a so-called line-of-sight process (where shadowing is a concern) and complex geometries may thus be coated. Complex three-dimensional parts (e.g. baffles with vanes, etc.) can thus be coated much more easily than in those processes.

A considerable degree of freedom is available to optimize the optical properties of the advanced cermet, including:
Thickness
Composition of the matrix (choice of the ceramic)
Nature of the involved metal
Size, density and density profile of the nanoparticles within the film
Fraction of carbon to metal According to a preferred embodiment of the method, the at least one first precursor and the second precursors are introduced into the reaction chamber at respective times, the reaction chamber being purged there between (e.g. by using a chemically inert gas like $N_2$ or the like), the introductions of the at least one first precursor and the second precursors being repeated plural times. The number of cycles may depend on several parameters, in particular the desired thickness, the duration of exposure of the substrate to each of the first and second precursors, the type of materials involved, etc.

The at least one first precursor and/or the second precursors may be inorganic precursors, such as, e.g., halides, carbonyls, nitrates, etc. Preferably, however, the at least one first precursor and/or the second precursors comprise metalorganic or organometallic compounds; still more preferably metal alkoxides or metal β-diketonates. Metalorganic or organometallic precursors are, preferred, as they are typically less toxic and corrosive than inorganic precursors and have lesser demands regarding recovery and disposal of reaction products.

The ceramic matrix formed from the first precursor is preferably a metal oxide matrix consisting of $VO_2$, $Al_2O_3$, $SiO_2$, MgO, $TiO_2$, $ZrO_2$, $Mn_3O_4$, $SnO_2$, ZnO, spinel having the general formula $AB_2O_3$ with A and B being metal cations having different valences, perovskite having the general formula $A'B'O_3$ with A' and B' being differently sized metal cations, or mixtures thereof.

The carbide nanoparticles formed from the second precursors preferably consist of carbides of metals selected from the group consisting of Ni, Co, Fe, Cr, Mo, Pt, Pd and mixtures thereof.

The method may comprise annealing the ceramic matrix with the embedded carbide nanoparticles so as to convert at least part of the carbide nanoparticles into metal-carbon composite nanoparticles.

Preferably, the CVD is pulsed spray evaporation CVD, the at least one first precursor being injected into the reaction chamber as a first precursor solution and the second precursors being injected into the reaction chamber as a second precursor solution. In that case, the first precursor solution preferably comprises vanadium oxy-tri-isopropoxide dissolved in an organic solvent (e.g. an alcohol) and the second precursor solution preferably comprises cobalt acetylacetonate and/or nickel acetylacetonate dissolved in alcohol.

It is one noteworthy advantage of the method that it does not require the presence of strong reducing agents for the metal components.

The deposition temperature is preferably not higher than 700° C., more preferably not higher than 650° C., more preferably not higher than 600° C. Preferably, the deposition temperature is selected in the range from 250° C. and 700° C., more preferably in the range from 300° C. to 650° C., still more preferably in the range from 400° C. to 650° C., even still more preferably in the range from 450° C. to 600° C.

In case of pulsed spray evaporation CVD, the rate of the injections of the first and/or the second precursors is preferably comprised in the range from 0.5 to 100 Hz, more preferably in the range from 1 to 50 Hz, even more preferably in the range from 1 to 25 Hz, still more preferably in the range from 1 to 10 Hz and most preferably in the range from 2 to 10 Hz. Still in case of pulsed spray evaporation CVD, the temperature of evaporation and/or transport is comprised in the range from 100° C. to 300° C., more preferably in the range from 150° C. to 250° C.

BRIEF DESCRIPTION OF THE DRAWINGS

By way of example, preferred, non-limiting embodiments of the invention will now be described in detail with reference to the accompanying drawings, in which.

DETAILED DESCRIPTION OF ONE OR MORE PREFERRED EMBODIMENTS

Figure 1:
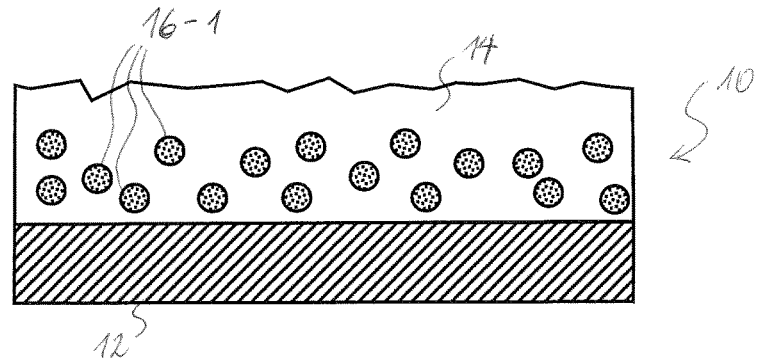
FIG. 1: is a transversal cross-sectional schematic of an advanced cermet with metastable carbide nanoparticles.
Figure 2:
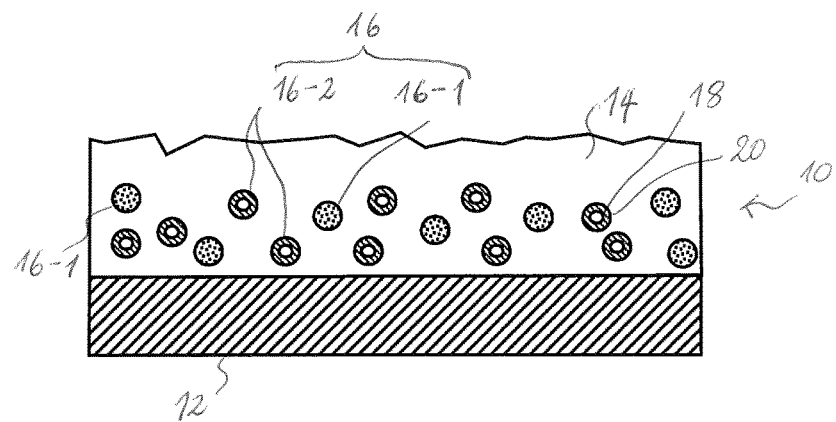
FIG. 2: is a transversal cross-sectional schematic of the advanced cermet of FIG. 1, wherein a part of the metastable carbide nanoparticles have decayed to their stable form.
Figure 3:
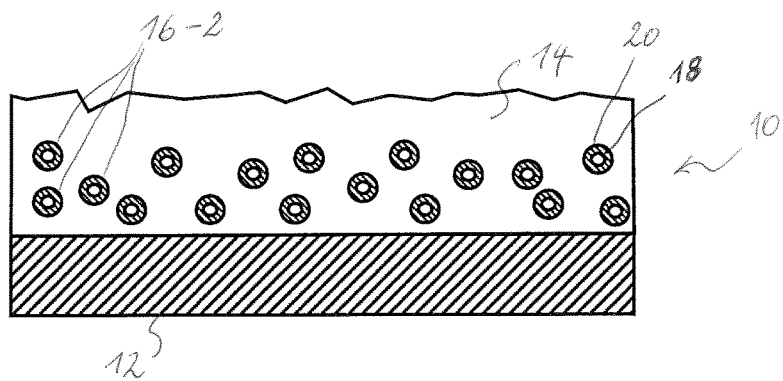
FIG. 3: is a transversal cross-sectional schematic of the advanced cermet of FIG. 1, wherein substantially all of the metastable carbide nanoparticles have decayed to their stable form.

An advanced cermet 10 according to a preferred embodiment of the invention is schematically depicted in FIGS. 1-3. The advanced cermet 10 is applied as a black coating on substrate 12. The advanced cermet 10 comprises a metal oxide matrix 14 with embedded nanoparticles 16-1, 16-2 (together referred to as 16). The nanoparticles 16-1 (FIGS. 1 and 2) are metastable metal carbide nanoparticles. The nanoparticles 16-2 (FIGS. 2 and 3) are the stable decay products of the metastable carbide nanoparticles 16-1. FIGS. 1 to 3 illustrate different states of the same advanced cermet 10.

In FIG. 1, 100% or close to 100% of the embedded nanoparticles are in the metastable carbide state. Such an advanced cermet may be obtained by depositing the nanoparticles at moderate temperatures, such that the transition from the carbide phase to the metal-carbon phase is thermodynamically improbable.

FIG. 2 shows the situation in which a certain amount of the carbide nanoparticles 16-1 have decayed so as to yield the metal-carbon composite nanoparticles 16-2. An advanced cermet in that state may be obtained by incompletely annealing the advanced cermet of FIG. 1 or by growing the nanoparticles 16 under conditions where the deposition of the carbide is followed with a certain probability by the annealing thereof.

Finally, FIG. 3 shows the completely annealed advanced cermet 10, in which all carbide nanoparticles have been transformed into the metal-carbon composite nanoparticles 16-2 with separate metal and carbon phases. As shown in FIGS. 2 and 3, the metal-carbon composite nanoparticles 16-2 have a core-shell configuration, the core 18 being formed by the metal phase whereas the shell 20 is formed by the carbon phase.

Figure 4:
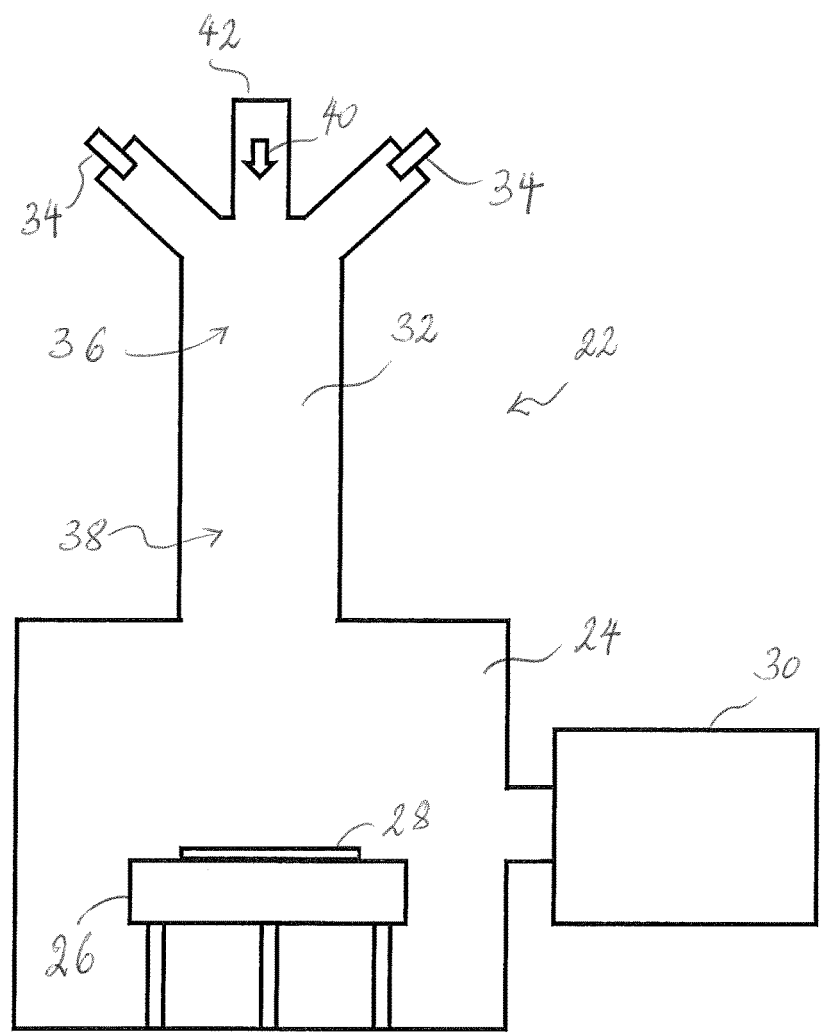
FIG. 4: is a schematic drawing of a CVD reactor equipped for pulsed-spray evaporation CVD.

FIG. 4 illustrates a CVD reactor 22 for carrying out pulsed-spray evaporation CVD of an advanced cermet. The CVD reactor comprises a main chamber 24 having arranged therein a substrate holder 26 with a substrate heater 28. The substrate (not shown in FIG. 4) may be placed on the substrate heater 28 by a manipulator (not shown). A vacuum pump 30 is connected to the main chamber, as well as a trap for the carrier gas (not shown). The precursors and the carrier gas may be introduced into the main chamber through a tubular evaporation and transport chamber 32. The evaporation and transport chamber 32 is equipped with heaters (not shown) allowing it to be brought to sufficiently high temperatures for the evaporation of the precursor solutions and the transport of the resulting vapour. The liquid precursor solutions are injected by respective injectors 34 into an evaporation zone 36 of the evaporation and transport chamber 32. In the evaporation zone 36, precursor vapours are then formed, which are transported by the carrier gas through a so-called transport zone 38 leading into the main chamber 32. The carrier gas (represented by arrow 40) may be introduced at a controlled flow rate through carrier gas inlet 42.

Figure 5:
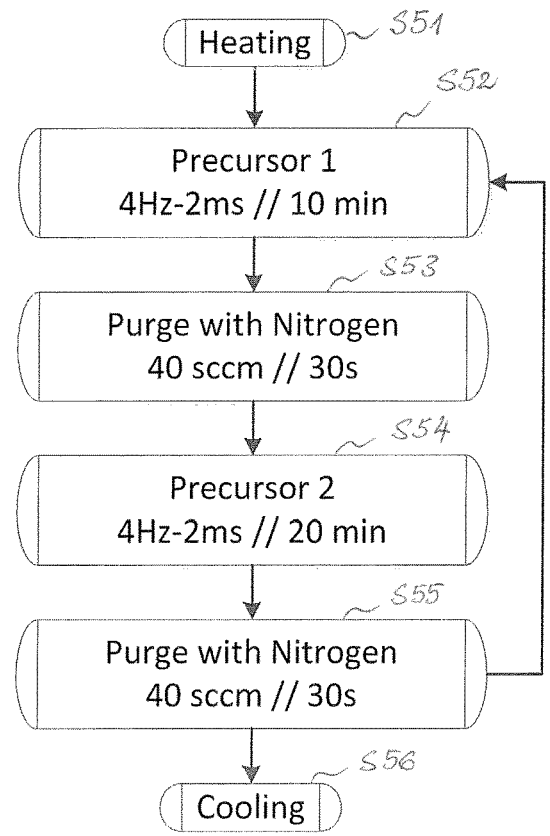
FIG. 5: is flow chart of an example of a pulsed-spray evaporation CVD process in accordance with a preferred embodiment of an aspect of the invention.

FIG. 5 shows a flow chart illustrating pulsed-spray evaporation CVD (PSE-CVD) according to a preferred embodiment of the invention. The sequence used and the numerical values in FIG. 5 are illustrative only and may be varied depending on the composition of the coating to deposit. In a first step (S51), the various parts of the reactor that is used to produce a black composite coating are heated to the desired temperatures. A first deposition phase of the ceramic matrix material from the first precursor(s) is then started. In the illustrated case, a first precursor solution containing the first precursor(s) is injected into the evaporation zone (step S52) at a predefined rate (4 Hz in the example) and with predefined opening times of the injector (2 ms for each injection in the example). The precursor vapour formed in the evaporation zone is transported by the carried gas into the main chamber of the reactor, where the ceramic matrix is deposited on the substrate. The injection regime of the first precursor solution is maintained for a predefined amount of time (10 minutes in the example), before the injections of the first precursor solution are stopped and the reactor is purged using the flux of carrier gas (step S53) during a first purge time (30 s with nitrogen in the illustrated example). A second precursor solution containing the precursors for the carbide nanoparticles is then injected into the evaporation zone (step S52) at a predefined rate (4 Hz in the example) and with predefined opening times of the injector (2 ms for each injection in the example). The vapour formed from the second precursors is transported into the main chamber, where the carbide nanoparticles are deposited from the second precursors. The injection regime of the second precursor solution is maintained for a predefined amount of time (20 minutes in the illustrated example), whereupon the reactor is again purged. The deposition steps are repeated a certain number of times. The injection parameters may be varied in accordance with the desired deposition profile. It should also be noted that the last deposition is not necessarily a deposition of the carbide nanoparticles but could be one of the ceramic matrix. When the growth of the advanced cermet has completed, the reactor is cooled down and the grown samples are taken out of the reactor.

The growth process of FIG. 5 may be greatly varied depending on the desired end product and the chemistry involved. For instance, while it may be preferable for practical reasons to have all first precursors necessary for the deposition of the ceramic matrix in one solution, separate precursor sources could also be used. The same holds for the second precursors. The deposition sequence may also be modified so as to lead to the incorporation of other (non-carbide) nanoparticles into the ceramic matrix, to result in the inclusion of two or more types of different carbide nanoparticles or to compounds of two or more metal carbides. By varying the deposition sequence, more complicated ceramic matrices may be grown, e.g. mixed oxide matrices, multi-layered matrices, etc.

The flux of the carrier gas may be held constant throughout the entire growth process. Alternatively, the flux of carrier gas could be varied so as to adjust or optimize the deposition conditions.

The temperature of the evaporation and transport chamber is also preferably held constant while the deposition goes on. If necessary or deemed advantageous, however, that parameter could also be changed over time. The same is true for the temperature of the substrate.

EXAMPLE

An advanced cermet with a $VO_2$ matrix having metastable $CoC_x$ nanoparticles embedded therein was grown on a silicon substrate using a CVD reactor of the Luxembourg Institute of Science and Technology (LIST), equipped with a PSE unit for the controlled injection of liquid feedstock. The precursors selected for this example were metal acetylacetonates and metal alkoxides that are easy to handle, store and implement. These precursors are soluble in ethanol and a large number of other solvents. In this example, ethanol was used for both the first and second precursors due to its reactivity with cobalt acetylacetonate ($Co(acac)_2$) above 220° C. to form metallic or carbide deposits depending on the temperature used. The first precursor solution was a 5 mM (5 mmol/l) solution of vanadium oxy-tri-isopropoxide ($VO(O^iPr)_3$) in ethanol. The second precursor solution was a 5 mM solution of $Co(acac)_2$ in ethanol. The precursor solutions were injected as pulsed sprays into an evaporation tube maintained at 220° C. under vacuum. The precursors' delivery was performed by 2 ms opening of the injector with a frequency of 4 Hz, which yielding respective feeding rates of 2.5 ml/min. The carrier gas was nitrogen introduced with a flow rate of 40 sccm (standard cubic centimeters per minute) maintained constant through the entire deposition process.

The deposition conditions are summarised in the following table:

| | |
|---|---|
| Pressure during deposition | 5 mbar |
| Carrier gas: nitrogen | 40 sccm |
| Precursor 1: VO(O$^i$Pr)$_3$ in ethanol | 0.005 mol/l |
| Delivery of the precursor 1 | 4 Hz, 2 ms opening time |
| Precursor 2: Co(acac)$_2$ in ethanol | 0.005 mol/l |
| Delivery of the precursor 2 | 4 Hz, 2 ms opening time |
| Temperature of evaporation and transport | 220° C. |
| Deposition temperature | 450-600° C. |

The deposition cycle was the following:
1. Precursor solution 1 during 10 minutes
2. Purge with nitrogen during 30 s,
3. Precursor solution 2 during 20 minutes,
4. Purge with nitrogen during 30 s.

The deposition cycle was carried out three times, followed by a deposition from precursor solution 1 lasting 22 minutes. After the total deposition time of 115 minutes, a film thickness of 1.1 μm was reached, which corresponded to an average growth rate of 9.5 nm/min.

To obtain an advanced cermet with stable metal-carbon composite nanoparticles, the metastable carbide nanoparticles embedded in the VO$_2$ matrix were converted into metal-carbon composite nanoparticles by annealing the advanced cermet obtained from the CVD in an inert atmosphere at 600° C. during 60 minutes.

Figure 6:
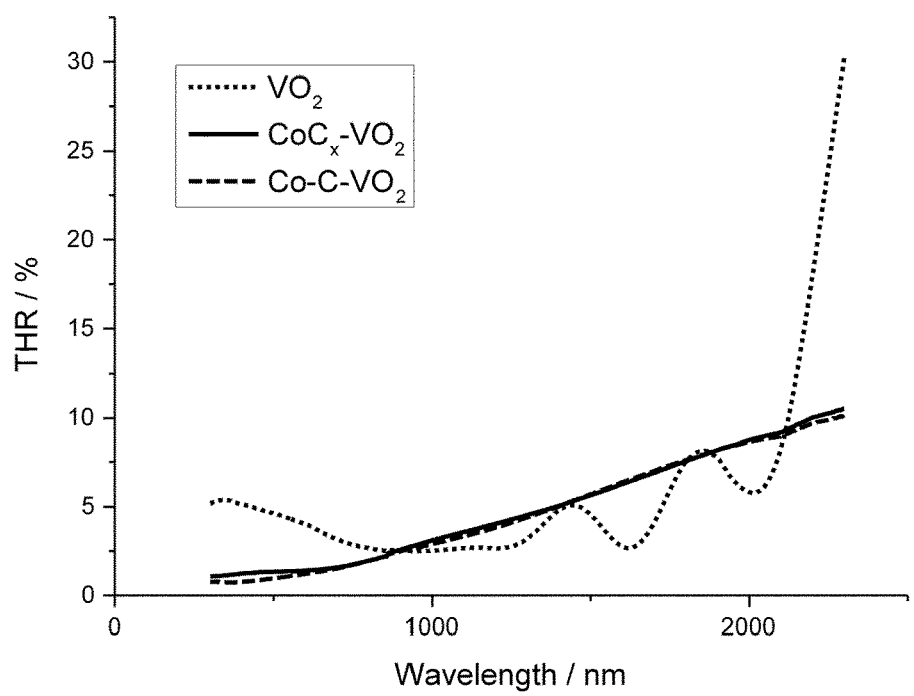
FIG. 6: is a diagram comparing the THRs of advanced cermets according to the invention with that of a metal oxide coating.
Figure 7:
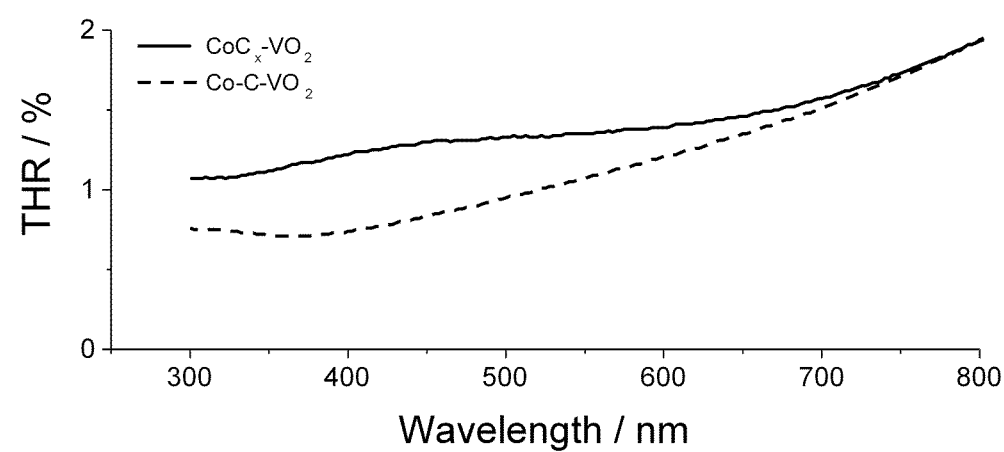
FIG. 7: is a diagram comparing the THRs of the advanced cermets of FIG. 6 in the near UV and visible wavelength range.

FIG. 6 shows a comparison of the THRs observed in the wavelength range of 300 to 2500 nm with an incidence angle of 8° for a pure VO$_2$ matrix, an advanced cermet with metastable CoC$_x$ nanoparticles embedded in a VO$_2$ matrix and an advanced cermet with stable Co—C composite nanoparticles embedded in a VO$_2$ matrix. The THR measurements were carried out using PerkinElmer Labsphere equipment, which covers the 250-2500 nm spectral range and which is equipped with an integration sphere. FIG. 7 is a close-up showing the comparison of the THRs of the advanced cermets in the near UV and visible light wavelength range.

While specific embodiments have been described herein in detail, those skilled in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of the appended claims and any and all equivalents thereof.

The invention is claimed is:

1. A black ceramic composite coating with a surface having a total hemispherical reflectivity of no more than 5% over the entire wavelength range from 400 nm to 1 μm and for any incidence angle greater than 20°,
comprising
a ceramic matrix distinct from a carbide matrix,
wherein said ceramic matrix has at least one of carbide nanoparticles and metal-carbon composite nanoparticles embedded therein,
the at least on of carbide nanoparticles and metal-carbon composite nanoparticles having an average size in the range from 5 to 500 nm,
wherein said carbide nanoparticles are metastable and wherein said metal-carbon composite nanoparticles are decay products of the metastable carbide nanoparticles.

2. The ceramic composite coating as claimed in claim 1, wherein
said ceramic matrix has metal-carbon composite nanoparticles embedded therein, said metal-carbon composite nanoparticles comprising metal cores with carbon shells.

3. The ceramic composite coating as claimed in claim 1, wherein said ceramic matrix is a metal oxide matrix.

4. The ceramic composite coating as claimed in claim 3, wherein
said metal oxide matrix consists of an oxide selected from the group consisting of: VO$_2$, Al$_2$O$_3$, SiO$_2$, MgO, TiO$_2$, ZrO$_2$, Mn$_3$O$_4$, SnO$_2$, ZnO, spinel having the general formula AB$_2$O$_3$ with A and B being metal cations having different valences, perovskite having the general formula A'B'O$_3$ with A' and B' being differently sized metal cations, and mixtures thereof.

5. The ceramic composite coating as claimed in claim 1, wherein
said carbide nanoparticles consist of carbides of metals selected from the group consisting of: Ni, Co, Fe, Cr, Mo, Pt, Pd, and mixtures thereof.

6. The ceramic composite coating as claimed in claim 5, wherein
the density of said at least one of the carbide nanoparticles and the metal-carbon composite nanoparticles in said matrix is non-uniform across the thickness of the ceramic composite coating.

7. A method of producing a ceramic composite coating by chemical vapour deposition,
the ceramic composite coating being a black ceramic composite coating with a surface having a total hemispherical reflectivity of no more than 5% over the entire wavelength range from 400 nm to 1 μm and for any incidence angle greater than 20°,
comprising
a ceramic matrix distinct from a carbide matrix,
the ceramic matrix having at least one of carbide nanoparticles and metal-carbon composite nanoparticles embedded therein,
the at least one of carbide nanoparticles and metal-carbon composite nanoparticles having an average size in the range from 5 to 500 nm,
said carbide nanoparticles being metastable and said metal-carbon composite nanoparticles being decay products of the metastable carbide nanoparticles,
said method comprising:
introducing at least one first precursor for depositing the ceramic matrix into a reaction chamber;
introducing second precursors for depositing the carbide nanoparticles into the reaction chamber, the second precursors comprising an inorganic, metalorganic or organometallic precursor and at least one of an alcohol and an aldehyde;
transporting the precursors to a substrate maintained at a deposition temperature; and
forming said ceramic matrix from the at least one first precursor and said embedded carbide nanoparticles from the second precursors.

8. The method as claimed in claim 7, wherein
the at least one first precursor and the second precursors are introduced into the reaction chamber at respective times,
the reaction chamber being purged there between,
the introductions of the at least one first precursor and the second precursors being repeated plural times.

9. The method as claimed in claim 7, wherein
the at least one first precursor and/or the second precursors comprise metalorganic or organometallic compounds.

10. The method as claimed in claim 7, wherein
the ceramic matrix formed from the first precursor is a metal oxide matrix consisting of oxide selected from the group consisting of: $VO_2$, $Al_2O_3$, $SiO_2$, MgO, $TiO_2$, $ZrO_2$, $Mn_3O_4$, $SnO_2$, ZnO, spinel having the general formula $AB_2O_3$ with A and B being metal cations having different valences, perovskite having the general formula A'B'O$_3$ with A' and B' being differently sized metal cations, and mixtures thereof.

11. The method as claimed in claim 7, wherein
said carbide nanoparticles formed from the second precursors consist of carbides of metals selected from the group consisting of: Ni, Co, Fe, Cr, Mo, Pt, Pd and mixtures thereof.

12. The method as claimed in claim 7, comprising
annealing the ceramic matrix with said embedded carbide nanoparticles so as to convert at least part of said carbide nanoparticles into metal-carbon composite nanoparticles.

13. The method as claimed in claim 7, wherein
the chemical vapour deposition is pulsed spray evaporation chemical vapour deposition,
wherein the at least one first precursor is injected into the reaction chamber as a first precursor solution and
wherein the second precursors are injected into the reaction chamber as a second precursor solution.

14. The method as claimed in claim 7,
wherein the at least one first precursor and the second precursors are introduced into the reaction chamber at respective times,
the reaction chamber being purged there between,
the introductions of the at least one first precursor and the second precursors being repeated plural times;
wherein the at least one first precursor and/or the second precursors comprise metalorganic or organometallic compounds;
wherein the ceramic matrix formed from the first precursor is a metal oxide matrix consisting of oxide selected from the group consisting of: $VO_2$, $Al_2O_3$, $SiO_2$, MgO, $TiO_2$, $ZrO_2$, $Mn_3O_4$, $SnO_2$, ZnO, spinel having the general formula $AB_2O_3$ with A and B being metal cations having different valences, perovskite having the general formula A'B'O$_3$ with A' and B' being differently sized metal cations, and mixtures thereof;
wherein said carbide nanoparticles formed from the second precursors consist of carbides of metals selected from the group consisting of: Ni, Co, Fe, Cr, Mo, Pt, Pd and mixtures thereof;
wherein said method comprises annealing the ceramic matrix with said embedded carbide nanoparticles so as to convert at least part of said carbide nanoparticles into metal-carbon composite nanoparticles;
wherein the chemical vapour deposition is pulsed spray evaporation chemical vapour deposition,
wherein the at least one first precursor is injected into the reaction chamber as a first precursor solution and wherein the second precursors are injected into the reaction chamber as a second precursor solution; and
wherein the first precursor solution comprises vanadium oxy-tri-isopropoxide dissolved in an organic solvent and wherein the second precursor solution comprises cobalt acetylacetonate and/or nickel acetylacetonate dissolved in an alcohol.

15. The method as claimed in claim 14, wherein the at least one first precursor or the second precursors comprise metal alkoxides or metal β-diketonates.

16. The method as claimed in claim 7, wherein the at least one first precursor or the second precursors comprise metal alkoxides or metal β-diketonates.

17. A black ceramic composite coating with a surface having a total hemispherical reflectivity of no more than 5% over the entire wavelength range from 400 nm to 1 μm and for any incidence angle greater than 20°,
comprising a ceramic matrix distinct from a carbide matrix;
wherein said ceramic matrix has at least one of carbide nanoparticles and metal-carbon composite nanoparticles embedded therein;
wherein the at least one of the carbide nanoparticles and the metal-carbon composite nanoparticles have an average size in the range from 5 to 500 nm,
wherein said carbide nanoparticles are metastable;
wherein said metal-carbon composite nanoparticles are decay products of the metastable carbide nanoparticles;
wherein said ceramic matrix has metal-carbon composite nanoparticles embedded therein, said metal-carbon composite nanoparticles comprising metal cores with carbon shells;
wherein said ceramic matrix is a metal oxide matrix.

18. The ceramic composite coating as claimed in claim 17, wherein said metal oxide matrix consists of $VO_2$ and wherein said metastable carbide nanoparticles comprise carbides of metals selected from the group consisting of: Ni, Co, Fe, Cr, Mo, Pt, Pd, and mixtures thereof.

19. The ceramic composite coating as claimed in claim 18, wherein said metastable carbide nanoparticles comprise $CoC_x$ nanoparticles.

* * * * *